(12) United States Patent
Hassan et al.

(10) Patent No.: US 10,950,739 B2
(45) Date of Patent: Mar. 16, 2021

(54) PHOTODIODE WITH IMPROVED POWER ABSORPTION

(71) Applicant: Commissariat a l'energie atomique et aux energies alternatives, Paris (FR)

(72) Inventors: Karim Hassan, Moneteau (FR); Salim Boutami, Grenoble (FR); Christophe Kopp, Fontanil-Cornillon (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 222 days.

(21) Appl. No.: 15/952,683

(22) Filed: Apr. 13, 2018

(65) Prior Publication Data
US 2018/0301570 A1    Oct. 18, 2018

(30) Foreign Application Priority Data

Apr. 13, 2017 (FR) .......................... 1753242

(51) Int. Cl.
*H01L 31/0232* (2014.01)
*G02B 6/12* (2006.01)
(Continued)

(52) U.S. Cl.
CPC .... *H01L 31/02327* (2013.01); *G02B 6/12002* (2013.01); *G02B 6/12004* (2013.01); *G02B 6/131* (2013.01); *H01L 31/022408* (2013.01); *H01L 31/105* (2013.01); *H01L 31/1808* (2013.01); *H01L 31/1812* (2013.01);
(Continued)

(58) Field of Classification Search
CPC .................................................... G02B 6/1228
See application file for complete search history.

(56) References Cited

U.S. PATENT DOCUMENTS

2004/0017975 A1    1/2004 Zheng et al.
2004/0057667 A1*   3/2004 Yamada ............... G02B 6/1228
                                                      385/43
(Continued)

OTHER PUBLICATIONS

French Preliminary Search Report dated Jan. 18, 2018 in French Application 17 53242 filed on Apr. 13, 2017 (with English Translation of Categories of Cited Documents and Written Opinion).
Hawkins, R. et al. "Optical power transfer in vertically integrated impedance-matched waveguide/ photodetectors: physics and implications for diode-length reduction," Optics Letters, vol. 16, No. 7, 1991, pp. 3.

(Continued)

*Primary Examiner* — Lex H Malsawma
*Assistant Examiner* — Geoffrey H Ida
(74) *Attorney, Agent, or Firm* — Oblon, McClelland, Maier & Neustadt, L.L.P.

(57) ABSTRACT

A photodiode which includes a core of a first waveguide that terminates in a tapered termination that extends above a core, made of germanium or of SiGe, of a second waveguide, a matching strip that extends opposite the tapered termination on one side and opposite the core of the second waveguide on the opposite side, this matching strip being coupled optically to the core of the second waveguide by an evanescent coupling and including a first zone inside which its effective propagation index is equal to the effective propagation index of a second zone of the tapered termination, these first and second zones optically coupling the tapered termination to the matching strip through a modal coupling, and a low-index layer that extends between the matching strip and the tapered termination.

10 Claims, 3 Drawing Sheets

(51) Int. Cl.
*H01L 31/0224* (2006.01)
*H01L 31/105* (2006.01)
*G02B 6/13* (2006.01)
*H01L 31/18* (2006.01)

(52) U.S. Cl.
CPC .............. *G02B 2006/12035* (2013.01); *G02B 2006/12061* (2013.01); *G02B 2006/12123* (2013.01); *G02B 2006/12138* (2013.01); *G02B 2006/12197* (2013.01)

(56) References Cited

U.S. PATENT DOCUMENTS

| | | | |
|---|---|---|---|
| 2005/0169593 A1* | 8/2005 | Hwang | G02B 6/12004 385/131 |
| 2007/0104411 A1* | 5/2007 | Ahn | G02B 6/12004 385/14 |
| 2007/0189688 A1 | 8/2007 | Dehlinger et al. | |
| 2008/0193076 A1 | 8/2008 | Witzens et al. | |
| 2009/0324164 A1 | 12/2009 | Reshotko et al. | |
| 2010/0330727 A1* | 12/2010 | Hill | G02F 1/025 438/69 |

OTHER PUBLICATIONS

Brouckaert, J. et al. "Thin-Film III-V Photodetectors Integrated on Silicon-on-Insulator Photonic ICs," Journal of Lightwave Technology, vol. 25, No. 4, Apr. 2007, pp. 8.
Dai, D. et al. "Silicon mode (de)multiplexer enabling high capacity photonic networks-on-chip with a single-wavelength-carrier light," Optics Letters, vol. 38, No. 9, 2013, pp. 3.
Denoyer, G. et al. "Hybrid Silicon Photonic Circuits and Transceiver for 50 Gb/s NRZ Transmission Over Single-Mode Fiber," Journal of Lightwave Technology, vol. 33, No. 6, 2015, pp. 8.
Hunsperger, R. "Integrated Optics," Theory and Technology, Sixth Edition, Springer, 2009, pp. 3.
Ramaswamy, A. et al. "High Power Silicon-Germanium Photodiodes for Microwave Photonic Applications," IEEE Transactions on Microwave Theory and Techniques, vol. 58, No. 11, Nov. 2010, pp. 8.
Vivien, L. et al. "42 GHz p.i.n. Germanium photodetector integrated in a silicon-on-insulator waveguide," Optics Express, vol. 17, No. 8, Apr. 2009, pp. 6.
Yariv, A. et al. "Supermode Si/III-V hybrid lasers, optical amplifiers and modulators: A proposal and analysis," Optics Express 9147, vol. 15, No. 15, Jul. 2007, pp. 5.

\* cited by examiner

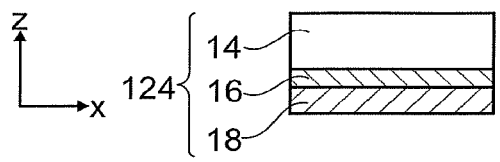 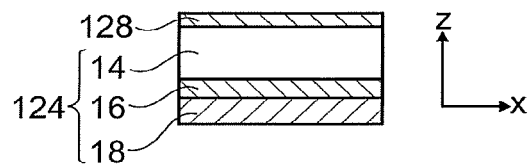
Fig. 6  Fig. 7
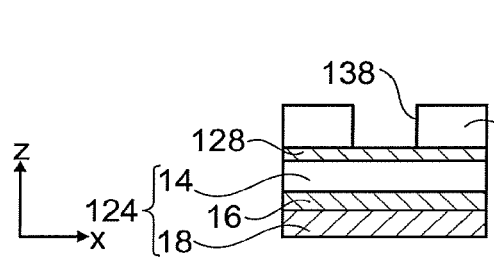 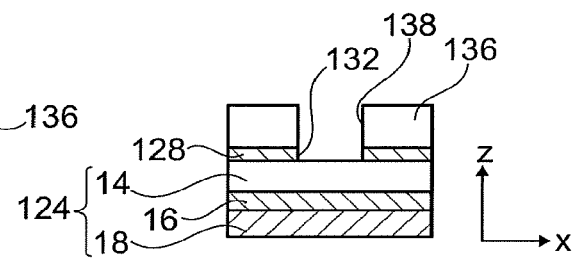
Fig. 8  Fig. 9
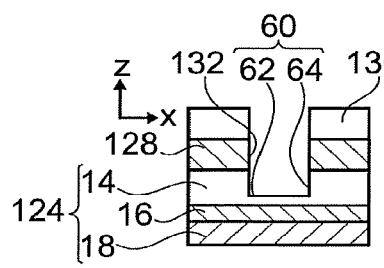 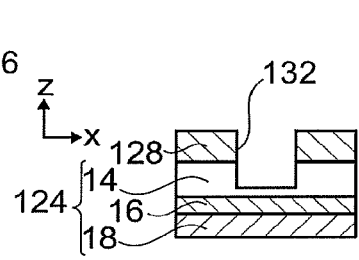 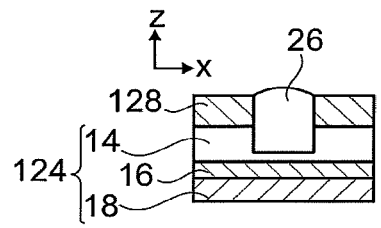
Fig. 10  Fig. 11  Fig. 12

PHOTODIODE WITH IMPROVED POWER ABSORPTION

BACKGROUND OF THE INVENTION

Field of the Invention

The invention relates to a photodiode for detecting an optical signal.

Description of Related Art

Known photodiodes include:

a substrate that extends mainly in a plane called the 'plane of the substrate', first and second contact terminals, first and second waveguides that have, over their entire length, different effective propagation indices, each of these waveguides including a core surrounded by a cladding, the optical signal propagating essentially inside the core, the cores of the first and second waveguides each extending mainly parallel to the plane of the substrate and being coupled optically to one another, the core of the second waveguide being made from germanium or from SiGe so as to transform the optical signal into electrical charges, first and second oppositely doped regions that electrically connect the core of the second waveguide, respectively, to the first and second contact terminals, such that the magnitude of the current between the first and second contact terminals varies depending on the power of the optical signal absorbed by the core of the second waveguide.

Such a known photodiode is for example described in the following article: Vivien L. et al: '42 GHz p.i.n Germanium photodetector integrated in a silicon-on-insulator waveguide', Optics Express, Vol. 17, No. 8, 13 Apr. 2009, pages 6252-6257. This article is hereinafter referred to as Vivien2009. In this article, the core of the first waveguide is made from silicon and the core of the second waveguide is made from germanium. The end of the core made of silicon bears directly on an opposite end, called 'input', of the core made of germanium. Such optical coupling between the cores of the waveguides made of silicon and of germanium is known under the term 'butt-coupling'.

In such a photodiode, the absorption profile of the optical signal inside the core made of germanium decreases exponentially. Thus, the absorption of the optical signal is at a maximum at the input of the core made of germanium, and then decreases very rapidly. In addition, the energy density of the optical signal inside the core made of germanium must not exceed a set limit. For example, this limit is set so as to correspond to the limit beyond which the energy density of the optical signal risks causing irreversible damage to the core made of germanium.

In these conditions, to boost the maximum power of the optical signal that is able to be absorbed by the known photodiode without exceeding the maximum admissible energy density, it is known to increase the transverse dimensions of the core made of germanium. Specifically, for an optical signal with the same power, increasing the transverse dimensions of the core made of germanium makes it possible to reduce the energy density of this optical signal at the input of the core made of germanium. This technique makes it possible to increase the maximum power of the optical signal that is able to be absorbed by the photodiode. However, it has the drawback of increasing the volume of the core made of germanium. It also has the drawback of slowing down the photodiode, that is to say that the photodiode reacts more slowly to the presence of an optical signal.

The same problem arises when germanium is replaced with SiGe.

Prior art is also known from US2004/017975A1, US2007/189688A1, US2009/324164A1 and from the following article: Raymond J. Hawkins et al: 'Optical power transfer in vertically integrated impedance-matched waveguide/photodetectors: physics and implications for diode-length reduction', Optics Letters, Vol. 16, No. 7, 1 Apr. 1991, page 470.

The invention aims to rectify this drawback by proposing a photodiode that, with a volume of germanium or of SiGe equal to known photodiodes, makes it possible to absorb optical signals of greater power without damaging the photodiode.

SUMMARY OF THE INVENTION

One subject thereof is therefore such a photodiode in accordance with claim 1.

As shown in the numerical simulations described further on, the absorption profile of the optical signal in the photodiode claimed is practically linear. The absorption of the optical signal is thus distributed more uniformly over the entire length of the core of the second waveguide of the photodiode claimed. The energy density of the absorbed optical signal hence no longer has a pronounced maximum at the input of the core made of germanium or of SiGe. In known photodiodes, this maximum limits the power of the optical signal that the photodiode is able to absorb. Hence, with the same dimensions of the core made of germanium or of SiGe, the photodiode claimed makes it possible to absorb an optical signal of greater power than with known photodiodes. Specifically, the absorption of the optical signal is better distributed over the entire length of the core made of germanium or of SiGe.

Embodiments of the photodiode may include one or more of the features of the dependent claims.

BRIEF DESCRIPTION OF THE DRAWINGS

The invention will be better understood upon reading the following description, given solely by way of nonlimiting example and made with reference to the drawings, in which:

FIGS. 6 to 12 are schematic illustrations, in cross section, of various states in the manufacture of the photodiode of FIG. 1.

DETAILED DESCRIPTION OF THE INVENTION

In these figures, the same references are used to denote the same elements. In the remainder of this description, the features and functions that are well known to those skilled in the art are not described in detail.

Figure 1:
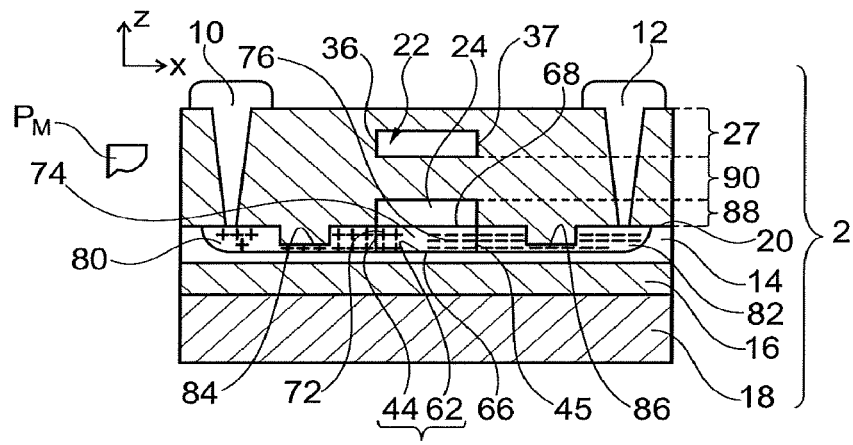
FIG. 1 is a schematic illustration, in a vertical and cross section, of a photodiode.
Figure 2:
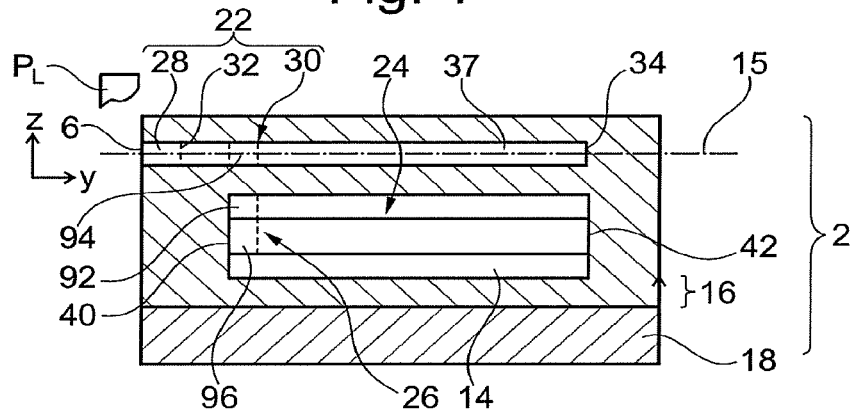
FIG. 2 is a schematic illustration, in a vertical and longitudinal section, of the photodiode of FIG. 1.
Figure 3:
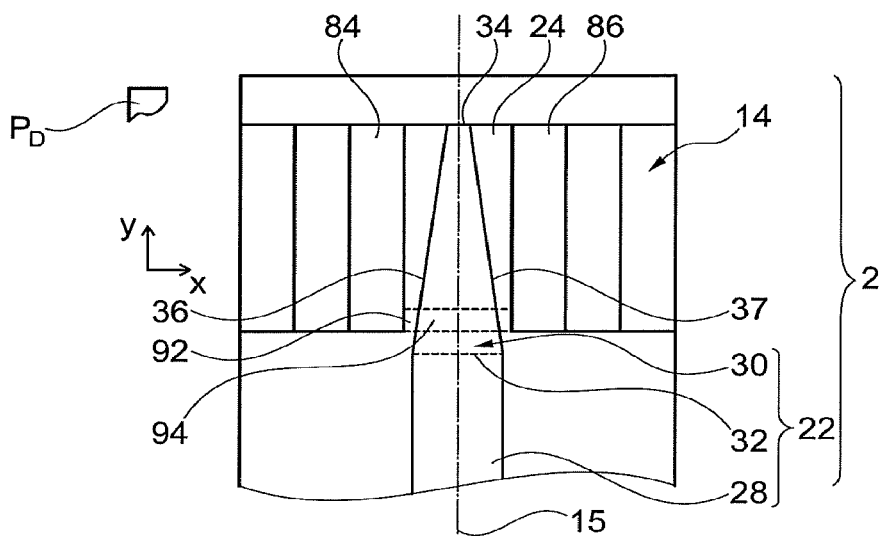
FIG. 3 is a partial schematic illustration, from above, of the photodiode of FIG. 1.

FIGS. 1, 2 and 3 show a photodiode 2 that is able to detect an optical signal entering via an input 6 of the photodiode 2. More precisely, the photodiode 2 converts the optical signal into an electrical signal generated between two contact terminals 10 and 12 (FIG. 1). Typically, the wavelength λ of the optical signal to be detected is between 1260 nm and 1625 nm, and preferably between 1260 nm and 1360 nm (O band) or between 1530 nm and 1565 nm (C band). In this case, the wavelength λ is equal to 1310 nm.

The photodiode 2 includes a plate 14 made of silicon that extends in a horizontal plane $P_D$ called the 'plane of the plate'. In this application, the figures are oriented with respect to an orthogonal coordinate system XYZ. The X and Y directions are horizontal and the Y direction is parallel to an optical axis 15 along which the optical signal propagates inside the photodiode 2. The Z direction is vertical. In this text, terms such as 'upper', 'above' and 'below' are defined with respect to the Z direction.

In this case, the expressions 'elements made from material M', 'elements made of material M' or CM elements' signify that more than 95% and, preferably, more than 97% or 99% of this element by mass is formed by the material M.

In this embodiment, the plate 14 is formed by the monocrystalline silicon layer of an SOI ('silicon-on-insulator') substrate. Consequently, it extends directly over a dielectric layer 16 that is itself directly deposited on a substrate 18.

The thickness $e_{14}$ of the plate 14 is typically greater than 50 nm or 100 nm and generally less than 1 μm. In this case, the thickness $e_{14}$ is equal to 300 nm.

The plate 14 has a horizontal upper face 20 on the side opposite the substrate 18.

The layer 16 is made from a material whose refractive index $n_{r16}$ is less than $0.8n_{r14}$ or $0.7n_{r14}$, where $n_{r14}$ is the refractive index of the material of the plate 14. For example, the layer 16 is made from silicon oxide ($SiO_2$) or from silicon nitride. The substrate 18 is for example made of silicon. Its thickness is typically greater than 140 μm or 500 μm or 725 μm.

The photodiode 2 includes:
a first waveguide comprising a core 22 and a cladding,
a matching strip 24, and
a second waveguide comprising a core 26 made of germanium.

In this embodiment, the photodiode 2 is symmetrical about a vertical longitudinal plane $P_L$ containing the optical axis 15. The strip 24 and the core 26 are also symmetrical about a vertical median plane $P_M$ perpendicular to the axis 15.

The core 22 routes the optical signal to be detected. It is coupled optically to the core 26 by way of the strip 24. The core 22 extends along the axis 15 in a horizontal plane situated above the strip 24. Its thickness $e_{22}$ is constant in this case. Generally, the thickness $e_{22}$ is greater than or equal to 50 nm or 100 nm and, preferably, less than 350 nm or 1000 nm. In this case, the thickness $e_{22}$ is equal to 300 nm.

In this embodiment, the core 22 is made of monocrystalline silicon. The core 22 is encapsulated in a silicon oxide layer 27 that forms the cladding of the first waveguide. The core 22 is delimited in the X direction by vertical lateral flanks that are each situated on one respective side of the axis 15.

The core 22 successively includes, in the Y direction, a parallelepipedal section 28 and a tapered termination 30. The section 28 extends along the axis 15 from the input 6 as far as the start 32 of the termination 30. The termination 30 itself also extends along the axis 15 from the start 32 as far as a distal end 34 beyond which the core 22 stops. In FIGS. 2 and 3, the position of the start 32 is shown by a dashed line.

The section 28 is shaped so as to guide the optical signal received at the input 6 as far as the termination 30. In this case, it is shaped so as to guide a single mode of the optical signal, such that the first waveguide is a single-mode waveguide. Inside the section 28, the vertical flanks of the core 22 extend parallel to one another. The section 28 forms only a single block of material with the termination 30.

Inside the termination 30, the cross section of the core 22 narrows gradually and continuously as it gets closer to the end 34. Thus, inside the termination 30, vertical flanks 36, 37 of the termination 30 gradually approach one another.

In practice, due to imperfections in the method for manufacturing the photodiode 2, the vertical flanks and the vertical edges that are described here are not perfectly vertical. For example, the angle between the vertical flanks or edges and the horizontal is between 80° and 100°. In the figures and in the remainder of this description, these imperfections are ignored.

The orthogonal projections of the flanks 36, 37 in a horizontal plane containing the axis 15 form two curves $f_1(y)$ and $f_2(y)$ that each gradually approach the axis 15. 'y' is the abscissa of these curves $f_1(y)$ and $f_2(y)$ along the axis 15. The curves $f_1(y)$ and $f_2(y)$ are continuous and able to be derived at any point, apart from at the start 32 and the end 34. In this case, these curves $f_1(y)$ and $f_2(y)$ approach the axis 15 in accordance with a law of $1/y^3$ if the origin of the abscissa y is situated at the start 32.

Hereinafter, when reference is made to the 'width' of the core of a waveguide, this denotes the shortest distance, measured in the X direction, between the vertical lateral flanks of this core. This width is typically between 200 nm and 3 μm. In this case, the width of the termination 30 is equal to 275 nm at the start 32 and equal to 120 nm at the end 34.

The core 26 absorbs the optical signal that it receives. More precisely, it transforms the optical signal into electrical charges. To this end, it is made from germanium. The core 26 is rectilinear and extends parallel to the axis 15 in a horizontal plane, from an input 40 as far as an end 42. The input 40 is that side of the core 26 furthest from the end 34. The core 26 is situated under the strip 24. Its thickness $e_{26}$ is constant. Generally, the thickness $e_{26}$ is greater than or equal to 50 nm or 100 nm and, preferably, less than 350 nm or 500 nm. In this case, the thickness $e_{26}$ is equal to 250 nm. In this embodiment, its cross section is rectangular and constant over its entire length in the Y direction. It is therefore delimited, in the X direction, by vertical lateral flanks 44 and 45 that are symmetrical with respect to one another about the plane $P_L$. Its width, in the X direction, is typically between 200 nm and 3 μm. In this case, its width is equal to 800 nm.

The core 26 is housed inside a cavity 60 hollowed out of the plate 14. The cavity 60 includes a horizontal bottom 62 and vertical edges formed inside the plate 14. The vertical edges are coincident with the lateral flanks 44 and 45 of the core 26.

The depth $P_{60}$ of the cavity 60 is strictly less than the thickness $e_{14}$ of the plate 14. For example, the difference between the thickness $e_{14}$ and the depth $P_{60}$ is greater than or equal to 20 nm or 30 nm, such that a thin layer of silicon remains under the cavity 60. In this case, the difference between the thickness $e_{14}$ and the depth $P_{60}$ is equal to 50 nm. For numerical simulations, the depth $P_{60}$ is chosen to be equal to 250 nm.

The horizontal cross section of the cavity 60 is identical to the horizontal cross section of the core 26.

The core 26 extends vertically from a lower horizontal face 66 as far as an upper face 68 on the opposite side. The faces 66 and 68 are connected to one another by the vertical lateral flanks 44, 45. The face 66 is planar and rests directly on the bottom of the cavity 60. In this case, the thickness $e_{26}$ of the core 26 is equal to the depth $P_{60}$ of the cavity 60. The face 68 is thus flush with the face 20 of the plate 14.

In order to obtain a current from the electrical charges generated by the optical signal when it interacts with the germanium, the core 26 is arranged so as to form a PiN ('positive-intrinsic-negative') diode. To this end, in the X direction, the core 26 includes three differently doped contiguous regions, namely:

a p-doped region 72;
an intrinsic region 74; and
an n-doped region 76.

In this case, the region 74 extends horizontally in the plane $P_L$ and the regions 72 and 76 are situated on either side of the longitudinal plane $P_L$. The regions 72 and 76 extend as far as the vertical flanks 44 and 45, respectively.

In order for a current to be able to flow through the photodiode 2, the region 72 is electrically connected to the terminal 10 by way of a p-doped region 80 formed inside the plate 14. More precisely, the region 80 extends from the vertical flank 44 of the core 26 as far as a lower end of the terminal 10. The region 80 is generally more doped than the region 72. The region 76 is electrically connected to the terminal 12 by way of an n-doped region 82 formed in the plate 14. The region 82 extends from the vertical flank 45 of the core 26 as far as the lower end of the terminal 12. The region 82 is generally more doped than the region 76.

Trenches 84 and 86 are hollowed out of the regions 80 and 82, respectively. These trenches extend parallel to the Y direction over the entire length of the core 26. At these trenches 84, 86, the thickness of the plate 14 is thinned, thereby making it possible to confine the optical signal to inside the core 26 more effectively.

The strip 24 makes it possible to obtain a practically linear optical absorption profile along the Y direction. To this end, the strip 24 is coupled optically on one side, by an evanescent coupling, to the core 26 and coupled optically on an opposite side, by a modal coupling, to the core 22. Evanescent couplings are well known. For example, they are defined in the following article: R. G. Hunsperger, Integrated Optics: Theory and Technology (Springer, 2002), pages 154-155.

Modal couplings are also well known. For example, they are defined in the following article: D. Dai et al., 'Silicon mode (de)multiplexer enabling high capacity photonic networks-on-chip with a single-wavelength-carrier light', Optics Letter 38(9), pp. 1422-1424, 2013.

An adiabatic coupling, such as described in the following article, is one particular case of a modal coupling: Amnon Yariv et al., 'Supermode Si/III-V hybrid Lasers, optical amplifiers and modulators: proposal and analysis', Optics Express 9147, vol. 14, No. 15, 23 Jul. 2007.

In this case, the strip 24 is made from the same material as the core 22. It is encapsulated inside a layer 88 of silicon oxide. The strip 24 thus forms a waveguide whose core is made of silicon and whose cladding is made of silicon oxide.

To obtain a good evanescent coupling between the strip 24 and the core 26, the strip 24 is deposited directly on the upper face 68 of the core 26. Its thickness $e_{24}$ is constant and generally greater than or equal to 50 nm or 100 nm and, typically, less than 350 nm or 500 nm. In this case, the thickness $e_{24}$ of the strip 24 is equal to 200 nm.

The cross section of the strip 24 is rectangular and constant over the entire length of the strip 24 in the Y direction. Its width, in the X direction, is less than or equal to the width of the core 26. In this case, its width is equal to the width of the core 26. Its length, in the Y direction, is in this case equal to the length of the core 26 in the same direction. The orthogonal projections of the strip 24 and of the core 26 over one and the same horizontal plane are thus coincident.

In order to obtain a modal coupling between the strip 24 and the core 22, the strip 24 is positioned under the termination 30 and separated from this termination 30 by a low-index layer 90. The layer 90 is said to be 'low-index' as it is made from a material whose refractive index $n_{r90}$ is less than or equal to $0.8 n_{rmin}$ or $0.7 n_{rmin}$ or $0.5 n_{rmin}$, where $n_{rmin}$ is the value of the smallest refractive index chosen from the refractive indices $n_{r22}$ and $n_{r26}$, where $n_{r22}$ and $n_{r26}$ are the refractive indices of the materials used for the cores 22 and 26, respectively. In this case, the indices $n_{r22}$ and $n_{r26}$ are therefore the refractive indices of silicon and of germanium, respectively. In this application, the various refractive indices are measured in the same conditions and for the wavelength of the optical signal to be detected. In this embodiment, the layer 90 is made from silicon oxide.

The layer 90 extends horizontally between the core 22 and the strip 24. Its thickness $e_{90}$ is constant. Generally, the thickness $e_{90}$ is between 20 nm and λ, where λ is the wavelength of the optical signal received at the input 6.

In order for a modal coupling to exist, there have to exist zones 92, 94 opposite the strip 24 and the first waveguide that have, for the wavelength λ, identical effective propagation indices. In FIGS. 2 and 3, the zones 92, 94 are delimited by dashed lines. However, these zones form only a single block of material with the rest of the core. The effective propagation index is also known under the name 'phase constant of the mode'. It is defined by the following relationship: $n_g = n_{eff} - \lambda dn_{eff}/d\lambda$, where $n_g$ is the group index and Λ is the wavelength of the optical signal guided by the guide. The effective propagation index of a waveguide depends on the dimensions of the core of this waveguide and on the materials forming this core and the cladding of this waveguide. It may be determined experimentally or by numerical simulation.

In this case, the zone 94 is situated above the zone 92 and inside the termination 30. The materials of the core 22 and of the strip 24 are identical. As a result, the dimensions of the cross section of the core 22 inside the zone 94 are adjusted so that the effective propagation index $n_{eff94}$ of the first waveguide inside the zone 94 is equal to the effective propagation index $n_{eff92}$ of the strip 24 inside the zone 92. Given that in this case the thickness of the core 22 is constant, it is the width of the termination 30 inside the zone 94 that is adjusted in order to obtain the equation $n_{eff92} = n_{eff94}$. In addition, upon this adjustment of the width of the termination 30 inside the zone 94, the option of having a width that decreases gradually and continuously in the Y direction is maintained.

Those skilled in the art know how to perform such an adjustment. For example, the thickness $e_{90}$ and the width of the zone 94 are typically adjusted experimentally, for example using numerical simulations, until the appropriate thickness $e_{90}$ and width are obtained. To this end, those skilled in the art are able to model and simulate the photodiode using numerical simulation software implementing the 3D-FDTD ('3-dimensional finite-difference time-domain') method. The 3D-BPM ('3-dimensional beam propagation method') may also be used.

The zone 92 is situated just above a zone 96 opposite the core 26. The zone 96 is situated inside the first quarter of the core 26. The first quarter of the core 26 corresponds to that portion of the core 26 that extends from the input 40, in the Y direction, over a quarter of its length. In this case, the zone 96 is situated at the right-hand end of the core 26 and therefore adjoins the input 40. By virtue of this, the optical signal enters the core 26 from the start thereof.

Thus, the core 22 is coupled optically to the core 26 successively by a modal coupling produced between the core 22 and the strip 24 followed by an evanescent coupling produced between the strip 24 and the core 26.

During operation of the photodiode 2, the optical signal is transferred from the core 22 as far as the core 26 firstly by way of the modal coupling between the core 22 and the strip 24 and then by way of the evanescent coupling between the strip 24 and the core 26. If the lengths, in the Y direction, of the cores 22, 26 and of the strip 24 are large enough, it is observed that the optical signal oscillates between the cores 22 and 26. In other words, along the Y direction, there are regularly distributed points Pt1 at which the optical signal is entirely inside the core 22, and points Pt2, situated midway between the points Pt1, at which the optical signal is entirely inside the core 26. The distance between two successive points Pt1 is equal to the period $P_o$ of oscillation of the optical signal between the cores 22 and 26. This period $P_o$ is proportional to the difference between the effective propagation indices of the first and second waveguides. The period $P_o$ is typically proportional or equal to $\lambda/\Delta$neff, where $\Delta$neff is the difference in effective indices between the first guide and the strip. In this case, to prevent these oscillations and to shorten the length of the photodiode 2, the modal coupling between the first guide and the strip 24 is controlled by the shape of the tapered termination 30. For example, the shape of the termination 30 is designed to make it increasingly difficult for the optical signal to return to the core 22 as the optical signal propagating inside the core 26 approaches the end 42. With such a design of the termination 30, generally, the length of the core 26 is between 1 μm and 100 μm, and preferably between 15 μm and 50 μm or between 20 μm and 40 μm. For the simulations described below, the length of the core 26 is equal to 40 μm. In this case, the length of the section of the termination 30 between the zone 94 and the end 34 is also equal to the length of the core 26.

Figure 4:
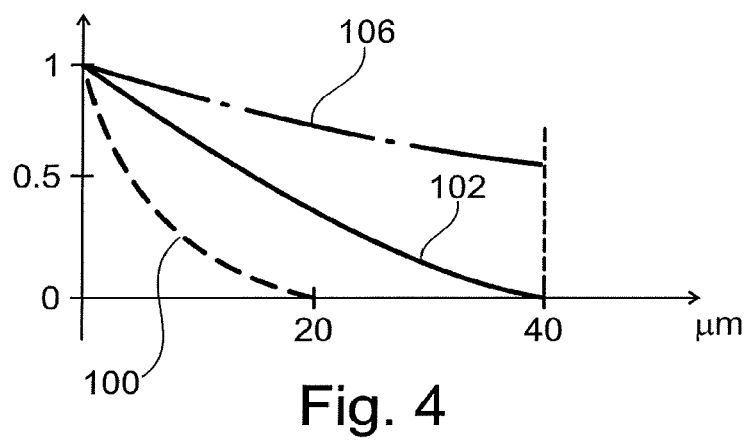
FIG. 4 is a graph depicting the absorption profile of the photodiode of FIG. 1.

FIG. 4 shows absorption profiles 100, 102 and 106 of the same optical signal obtained by simulating three different photodiode configurations. In this figure, the abscissa axis represents the distance, in the Y direction, measured from the input 40. The ordinate axis represents the level of absorption of the optical signal by the core 26. The value '1' of the level of absorption corresponds to a level of absorption of 0%, and the value '0' corresponds to a level of absorption of 100% of the optical signal inside the core 26.

The profile 100 was obtained by simulating a configuration identical to the photodiode 2, except that:
the core 22 does not have a tapered termination, and
the core 22 is coupled optically to the core 26 by placing the end of the core 22 in abutment with the input 40 of the core 26 in one and the same horizontal plane.

Such optical coupling between the cores 22 and 26 is known under the term 'butt-coupling'. This configuration does not include a strip 24. It corresponds to the configuration described in the article Vivien2009.

The profile 102 was obtained by simulating the photodiode 2 with the dimensions described above.

The profile 106 was obtained by simulating a configuration identical to that of the photodiode 2, except that the strip 24 is omitted.

These simulations were performed for a wavelength of 1.31 μm of the optical signal and by implementing the 3D-BPM method.

The profile 100 shows that, in known configurations, the absorption profile is strongly non-linear and that an absorption maximum occurs at the input 40 of the core 26.

The profile 102 shows that, by contrast, the absorption profile of the photodiode 2 is much more linear. Thus, with identical dimensions of the core 26, the photodiode 2 is able to absorb optical signals of greater power without exceeding the maximum energy density set as being acceptable to the core 26.

Lastly, the profile 106 shows that, in the absence of the strip 24, the absorption profile is much more linear, but the absorption of the optical signal by the core 26 is less effective. Hence, in order to absorb practically all of the optical signal, it is necessary to greatly increase the length of the core 26. For example, in the case of the simulated configuration, it would be necessary to more than double the length of the core 26 in order to absorb the same amount of optical signal than with the photodiode 2. The term 'absorb practically all of the optical signal' is used to denote the absorption of at least 90% or 95% of the energy of this optical signal.

The manufacture of the photodiode 2 will now be described with the aid of the flowchart of FIG. 5 and with reference to FIGS. 6 to 12.

The method begins with a step 118 of providing an SaI substrate 124 (FIG. 6) corresponding to the stack of the substrate 18, of the layer 16 and of the plate 14.

In a step 126, a protective layer 128 (FIG. 7) is deposited on the upper face 20 of the plate 14. This layer 128 is made from a material on which germanium is not able to grow during an operation of vapour phase epitaxial growth of germanium. For example, the layer 128 is made from silicon dioxide. Its thickness is typically greater than or equal to 50 nm and generally less than 1 μm.

Next, in a step 130, a cavity 132 (FIG. 9) having the same horizontal cross section as the core 26 is hollowed out of the layer 128 at the location where the cavity 60 is to be formed. For example, the cavity 132 is formed by means of photolithography. To this end, in an operation 134, a layer 136 (FIG. 8) of photosensitive resin is deposited on the upper face of the layer 128. Next, a recess 138 (FIG. 8) which passes all the way through the thickness of the resin layer 136 is produced in order to expose the portion of the upper face of the layer 128 to be etched. The horizontal cross section of the recess 138 is identical to the horizontal cross section of the core 26.

Next, in an operation 142, the layer 128 is etched through the recess 138 in order to obtain the cavity 132.

In a step 144, the cavity 132 (FIG. 10) is extended, in the vertical direction, inside the plate 14 in order to form the cavity 60 in this plate 14. In this step 144, the layers 128 and 136 are therefore used as a mask, that is to say that the plate 14 is etched through the cavities 132 and 138. The etching of the plate 14 is interrupted before reaching the layer 16 so that a thin layer of silicon of at least 30 nm in thickness remains between the bottom 62 of the cavity 60 and the layer 16.

In a step 148 (FIG. 11), the resin layer 136 is removed in order to expose the upper face of the layer 128.

In a step 150 (FIG. 12), an operation of vapour phase epitaxial growth of germanium is carried out on the bottom 62 of the cavity 60 until this cavity 60 is completely filled. Typically, this operation is carried out by implementing a method known by the acronym RP-CVD ('reduced-pressure chemical vapour deposition'). To this end, a low thickness of germanium is firstly deposited at low temperature directly on the bottom 62. For example, the term 'low temperature' is understood to mean a temperature of less than 400° C. In this first phase, the temperature is also generally higher than 200° C. The term 'low thickness' is understood to mean a thickness of less than 50 nm and generally more than or equal to 30 nm. In this case, in the first phase, the thickness of germanium deposited on the bottom 62 is 40 nm.

Next, a second phase of growing the germanium layer inside the cavity 60 is carried out at a higher temperature. Typically, in the second phase, the temperature is higher than 650° C. or 700° C. In this case, it is 730° C. This second phase is used to deposit at least 210 nm of germanium inside the cavity 60 and therefore completely fill this cavity. At this stage, the thickness of germanium is equal to or greater than the desired thickness $e_{26}$.

Such a method for growing germanium inside a cavity is described for example in the article Vivien2009. This method is therefore not described here in greater detail.

In step 150, the deposited thickness $e_{26}$ of germanium remains lower than the critical thickness beyond which the number of dislocation defects in the germanium becomes very large. In step 150, the germanium grows solely inside the cavity 60 and not on the layer 128.

In a step 152, the layer 128 is removed and polishing is then carried out, for example by chemical-mechanical polishing (CMP), in order to eliminate the thickness of germanium that protrudes beyond the face 20 of the plate 14, without otherwise removing the thickness of germanium housed inside the cavity.

Next, in a step 154, the core 26 and the plate 14 are locally doped in order to obtain the doped regions 72, 76, 80 and 82. This doping is necessary in order to recover the photocurrent.

Then, in a step 156, the trenches 84, 86 are etched inside the regions 80 and 82, respectively.

In a step 158, the strip 24 is produced on the face 68 of the core 26. For example, after step 156, the core 26 is encapsulated in the layer 88 of silicon oxide. A cavity with the same dimensions and at the same location as the future strip 24 is hollowed out of this layer 88. Lastly, amorphous silicon is deposited in this cavity in order to form the strip 24. Chemical-mechanical polishing is then carried out in order to eliminate the thickness of amorphous silicon that protrudes beyond the upper face of the layer 88.

In a step 162, the low-index layer 90 is deposited, and then its upper face is polished in order to prepare it for direct bonding, also known under the name 'molecular bonding'.

In a step 164, a second SOI substrate containing the core 22 is bonded, for example by direct bonding, onto the upper face of the layer 90, such that the termination 30 is located opposite the strip 24 and separated from this strip 24 by the single layer 90. For example, similarly to what was described with reference to FIG. 6, this second SOI substrate includes a substrate, for example made of silicon, on which a dielectric layer and a plate made of monocrystalline silicon are successively deposited. The manufacture, before step 164, of the first waveguide in the monocrystalline silicon layer of the second SOI substrate is conventional, and will not be described in further detail at this juncture. After the bonding of the second SOI substrate, the silicon substrate of the second SOI substrate is removed, for example, by mechanical thinning and CMP polishing, stopping on the dielectric layer of the second SOI substrate. The photodiode 2 is then obtained.

Variants of the core made of germanium:

The core 26 may be made from other semiconductor materials that are capable of absorbing the optical signal while at the same time having a refractive index at least 1.1 times greater than that of the cladding of the second waveguide. For example, the core 26 may be made from SiGe.

As a variant, the core 26 does not have any doped region. In this case, its non-doped vertical flanks are directly in contact with corresponding vertical edges of the regions 80 and 82.

In another variant, the lengths of the strip 24 and of the core 26 are strictly greater than the period $P_o$ of oscillation of the optical signal between the cores 22 and 26. In this case, several oscillations of the optical signal between the cores 22 and 26 are required before said signal is practically completely absorbed by the core 26. The practically complete absorption of the optical signal is achieved over a greater length.

The zone 96 is not necessarily situated inside the first quarter of the core 26. For example, as a variant, the zone 96 is situated in the middle of the core 26.

As a variant, the core 26 is produced on the face 20 of the plate 14 made of silicon, and not in a cavity hollowed out of this plate 14. In this embodiment, the cavity 60 is therefore omitted.

As a variant, the thickness $e_{26}$ is strictly greater than the depth $P_{60}$ of the cavity 60. In this case, the face 68 of the core 26 projects above the face 20 of the plate 14.

Variants of the core 22:

Other shapes are possible for the termination 30 of the core 22. For example, the orthogonal projections in a horizontal plane of the vertical flanks of the termination 30 may follow curvilinear or rectilinear paths. These flanks may approach one another rapidly or, by contrast, very slowly.

The core 22 may be positioned under the core 26, and not above as described above. In this case, the strip 24 is also situated under the core 26.

The core 22 may be made from other materials whose refractive indices are close to that of the strip 24, that is to say between $0.7n_{r24}$ and $1.3n_{r24}$, and preferably between $0.9n_{r24}$ and $1.1n_{r24}$, where $n_{r24}$ is the refractive index of the material used to manufacture the strip 24. For example, when the strip is made of silicon, the core 22 may be made from silicon nitride.

In another variant, the end 34 of the termination 30 goes beyond the end 42 of the core 26 in the Y direction.

The core 22 may be replaced with a core that is dimensioned such that the first waveguide is multimode.

Variants of the strip 24:

The strip 24 may be made from other materials having a refractive index close to that of the material used to produce the core 22, that is to say between $0.7n_{r22}$ and $1.3n_{r22}$, and preferably between $0.9n_{r22}$ and $1.1n_{r22}$, where $n_{r22}$ is the refractive index of the core 22 for the wavelength $\lambda$ of the optical signal. For example, the strip may be made from SiN or from polycrystalline silicon.

Other shapes are possible for the strip 24. For example, the orthogonal projection in a horizontal plane of the vertical flanks of the strip 24 may form a trapezoid or a triangle whose width increases or, by contrast, decreases in the Y direction. In this case, generally, the strip includes a zone where its width is greater than the width of a zone opposite the termination 30, and another zone where its width is strictly less than the width of another zone opposite the termination 30.

The strip 24 is not necessarily directly in contact, over its entire length, with the core 26. As a variant, a low-index thin layer is interposed between the strip 24 and the core 26. The refractive index of this thin layer is less than $0.8n_{rmin}$ or less than $0.7n_{rmin}$. For example, this thin layer is made from the same material as the layer 90. The thickness of this thin layer is small enough to allow the evanescent optical coupling between the strip 24 and the core 26. This thickness is typically determined experimentally, and in particular through numerical simulation using, for example, the simulation software cited above.

The length of the strip 24 in the Y direction may be greater than the length of the core 26 in this same direction. In this case, one end of the strip 24 goes beyond the core 26. On the other hand, the length of the strip 24 in the Y direction may also be less than the length of the core 26. In this case, the end 42 of the core 26 goes beyond the strip 24 in the Y direction.

Other possible variants of the photodiode:

Materials other than silicon oxide are possible for forming the claddings of the first and second waveguides. For example, the silicon oxide may be replaced with silicon nitride, $TiO_2$, $Al_2O_3$, aluminium nitride or else other materials, such as chalcogenide materials.

After tailoring the dimensions of the photodiode, the latter may be used to process optical signals whose wavelengths are contained in the C band, that is to say for wavelengths of between 1500 and 1565 nm.

In another variant, the trenches 84 and 86 are omitted.

As a variant, the strip 24 is wider, in the X direction, than the core 26. In this case, in the X direction, the strip goes beyond either side of the core 26. In another variant, the strip 24 is not as wide as the core 26 in the X direction. In the latter case, the orthogonal projection of the strip 24 over the plane of the substrate is then strictly contained inside the orthogonal projection of the core 26 over this same plane.

Figure 5:
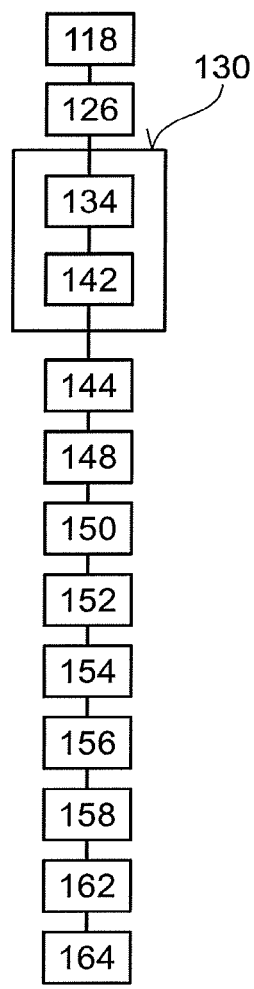
FIG. 5 is a flowchart of a method for manufacturing the photodiode of FIG. 1.

Variants of the manufacturing method:

The photodiodes described above may also be manufactured using methods other than the method of FIG. 5. For example, as a variant, the layer 128 is omitted in the manufacturing method. In this case, in the germanium growth step, the germanium layer also grows not only inside the cavity 60 but also over the entirety of the face 20 of the plate 14 made of silicon. Next, a polishing step, for example chemical-mechanical polishing (CMP), is implemented in order to eliminate the thickness of germanium present on the upper face 20 of the plate 14 without otherwise removing the thickness of germanium housed inside the cavity 60.

Technical advantages of the various described embodiments:

The fact that the strip 24 is directly in contact with the core 26 improves the evanescent coupling between this strip and this guide. The optical signal is therefore transferred more effectively to the core 26, thereby improving its absorption by the core 26.

Choosing the length of the core 26 to be strictly less than 50 µm makes it possible to prevent oscillations of the optical signal between the cores 22 and 26 when the wavelength of the optical signal is between 1260 nm and 1625 nm. Specifically, in this case, this length of the core 26 is strictly less than the period $P_o$ and preferably less than $0.9P_o$ or $0.7P_o$. This therefore makes it possible both to shorten the length of the core 26 and therefore to improve the compactness of the photodiode, while at the same time maintaining the efficiency thereof.

The fact that the width of the strip 24 is less than or equal to that of the core 26 makes it possible to improve the confinement of the optical signal to within the core 26. The efficiency of the photodiode, that is to say the ratio between the initial power of the optical signal and the magnitude of the current generated by the photodiode in response to the absorption of this optical signal, is thus improved.

The fact that the width of the strip 24 is equal to the width of the core 26 makes it possible both to improve the efficiency of the photodiode and to reduce the response time of the photodiode. The response time of the photodiode is the time necessary for a detectable current to be established between the contact terminals 10, 12 in response to an optical signal. The shorter the response time, the higher the bandwidth of the photodiode.

Arranging the strip 24 such that the zone 92 is situated facing the start of the core 26 makes it possible to shorten the length of the core 26.

The invention claimed is:

1. A photodiode for detecting an optical signal, comprising:
   a substrate that extends mainly in a plane,
   first and second contact terminals,
   first and second waveguides that have, over their entire length, different effective propagation indices, each of these waveguides including a core surrounded by a cladding, the optical signal propagating essentially inside the core, the cores of the first and second waveguides each extending mainly parallel to the plane of the substrate and being coupled optically to one another, the core of the second waveguide being made from germanium or from SiGe so as to transform the optical signal into electrical charges,
   first and second oppositely doped regions that electrically connect the core of the second waveguide, respectively, to the first and second contact terminals, such that the magnitude of the current between the first and second contact terminals varies depending on the power of the optical signal absorbed by the core of the second waveguide,
   wherein:
   the core of the first waveguide terminates in a tapered termination that extends parallel to the plane of the substrate,
   the cores of the first and second waveguides are separated by a low-index layer to form a stacked structure, with the core of the first waveguide being above or below the core of the second waveguide,
   the photodiode includes a matching strip that extends opposite the tapered termination on one side and opposite the core of the second waveguide on the opposite side, the matching strip being coupled optically to the core of the second waveguide by an evanescent coupling and including a first zone inside which its effective propagation index is equal to the effective propagation index of a second zone of the tapered termination situated opposite the first zone, these first and second zones thus optically coupling the tapered termination to the matching strip through a modal coupling, and
   the low-index layer extends parallel to the plane of the substrate between the matching strip and the tapered termination, the low-index layer being made from a material whose refractive index is less than $0.8n_{min}$, where $n_{min}$ is the value of the smallest refractive index chosen from the group consisting of the refractive indices of the materials used to form the cores of the first and second waveguides, respectively, the refractive indices being measured, in the same conditions, at the wavelength λ of the optical signal.

2. The photodiode according to claim 1, wherein the matching strip is mechanically directly in contact with the core of the second waveguide.

3. The photodiode according to claim 1, wherein the length of the core of the second waveguide in the direction of propagation of the optical signal is less than 50 μm.

4. The photodiode according to claim 1, wherein the width of the entire cross section of the matching strip opposite the core of the second waveguide, in a direction parallel to the plane of the substrate and perpendicular to the direction of propagation of the optical signal, is less than or equal to the width of the core of the second waveguide in the same direction.

5. The photodiode according to claim 4, wherein the width of the entire cross section of the matching strip opposite the core of the second waveguide is equal to the width of the core of the second waveguide.

6. The photodiode according to claim 1, wherein the first zone of the matching strip is situated opposite a third zone of the core of the second waveguide, this third zone being situated in the direction of propagation of the optical signal, inside the first quarter of the core of the second waveguide.

7. The photodiode according to claim 1, wherein the tapered termination includes lateral flanks that gradually and continuously approach one another, going in the direction of propagation of the optical signal, from the second zone as far as a distal end beyond which the core of the first waveguide no longer exists.

8. The photodiode according to claim 1, wherein the core of the first waveguide and the matching strip are made from silicon.

9. The photodiode according to claim 1, wherein the thickness of the low-index layer is greater than or equal to 20 nm and less than λ, where λ is the wavelength of the optical signal propagating inside the first waveguide.

10. The photodiode according to claim 1, wherein, regardless of the selected zones opposite the first and second waveguides, the difference between the effective propagation indices of the first and second waveguides inside these two opposite zones is greater than $0.05n_{\mathit{eff}1}$, where $n_{\mathit{eff}1}$ is the effective propagation index inside the zone of the first waveguide.

* * * * *